(12) United States Patent
Sharan et al.

(10) Patent No.: US 11,276,635 B2
(45) Date of Patent: Mar. 15, 2022

(54) HORIZONTAL PITCH TRANSLATION USING EMBEDDED BRIDGE DIES

(71) Applicant: Intel Corporation, Santa Clara, CA (US)

(72) Inventors: Sujit Sharan, Chandler, AZ (US); Kemal Aygun, Tempe, AZ (US); Zhiguo Qian, Chandler, AZ (US); Yidnekachew Mekonnen, Chandler, AZ (US); Zhichao Zhang, Chandler, AZ (US); Jianyong Xie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/636,620

(22) PCT Filed: Sep. 29, 2017

(86) PCT No.: PCT/US2017/054359
§ 371 (c)(1),
(2) Date: Feb. 4, 2020

(87) PCT Pub. No.: WO2019/066909
PCT Pub. Date: Apr. 4, 2019

(65) Prior Publication Data
US 2020/0381350 A1    Dec. 3, 2020

(51) Int. Cl.
*H01L 23/48*    (2006.01)
*H01L 23/498*   (2006.01)
*H01L 23/00*    (2006.01)

(52) U.S. Cl.
CPC .. *H01L 23/49838* (2013.01); *H01L 23/49816* (2013.01); *H01L 23/49822* (2013.01); *H01L 24/16* (2013.01); *H01L 2224/16225* (2013.01)

(58) Field of Classification Search
CPC .................... H01L 23/5381; H01L 23/538
See application file for complete search history.

(56) References Cited

U.S. PATENT DOCUMENTS 8,866,308 B2 * 10/2014 Roy ............... H01L 23/5385
257/777
8,946,900 B2 *  2/2015 Qian .............. H01L 23/49827
257/762

(Continued)

FOREIGN PATENT DOCUMENTS

WO    WO 2017/074391    5/2017
WO    WO 2017/111957    6/2017

OTHER PUBLICATIONS

International Search Report and Written Opinion for International Patent Application No. PCT/US2017/054359 dated Jun. 29, 2018, 13 pgs.

(Continued)

*Primary Examiner* — Nicholas J Tobergte
(74) *Attorney, Agent, or Firm* — Schwabe, Williamson & Wyatt, P.C.

(57) ABSTRACT

Methods/structures of joining package structures are described. Those methods/structures may include a die disposed on a surface of a substrate, wherein the die comprises a plurality of high density features. An interconnect bridge is embedded in the substrate, wherein the interconnect bridge may comprise a first region disposed on a surface of the interconnect bridge comprising a first plurality of features, wherein the first plurality of features comprises a first pitch. A second region disposed on the surface of the interconnect bridge comprises a second plurality of features comprising a second pitch, wherein the second pitch is greater than the first pitch.

22 Claims, 7 Drawing Sheets

(56) References Cited

U.S. PATENT DOCUMENTS

| | | | |
|---|---|---|---|
| 9,349,703 B2* | 5/2016 | Chiu | H05K 3/4694 |
| 9,420,693 B2* | 8/2016 | Sankman | H05K 3/467 |
| 9,548,264 B2* | 1/2017 | Roy | H05K 1/141 |
| 9,595,496 B2* | 3/2017 | Lee | H01L 23/5385 |
| 9,607,947 B2* | 3/2017 | Karhade | H01L 23/49894 |
| 2010/0327424 A1 | 12/2010 | Braunisch | |
| 2012/0261838 A1 | 10/2012 | Braunisch et al. | |
| 2014/0159228 A1 | 6/2014 | Teh et al. | |
| 2014/0175636 A1 | 6/2014 | Roy et al. | |
| 2014/0264915 A1 | 9/2014 | Huang et al. | |
| 2016/0300824 A1* | 10/2016 | Karhade | H01L 23/5383 |
| 2017/0125334 A1* | 5/2017 | Wang | H01L 23/3114 |

OTHER PUBLICATIONS

Search Report from European Patent Application No. 17927534.2, dated Apr. 16, 2021, 7 pgs.

* cited by examiner

HORIZONTAL PITCH TRANSLATION USING EMBEDDED BRIDGE DIES

CROSS-REFERENCE TO RELATED APPLICATION

This patent application is a U.S. National Phase Application under 35 U.S.C. § 371 of International Application No. PCT/US2017/054359, filed Sep. 29, 2017, entitled "HORIZONTAL PITCH TRANSLATION USING EMBEDDED BRIDGE DIES," which designates the United States of America, the entire disclosure of which is hereby incorporated by reference in its entirety and for all purposes.

BACKGROUND

With the advancement of microelectronic fabrication processes to smaller nodes, and transistor density increase, the area of a microelectronic chip/device has become smaller. This smaller device size and consequent increase in pin count may result in die/devices comprising fine bump pitch. Bonding dies with very fine bump pitch to package substrates becomes challenging due to added fabrication requirements and costs, such as integrating silicon interposers with through silicon vias, for example.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
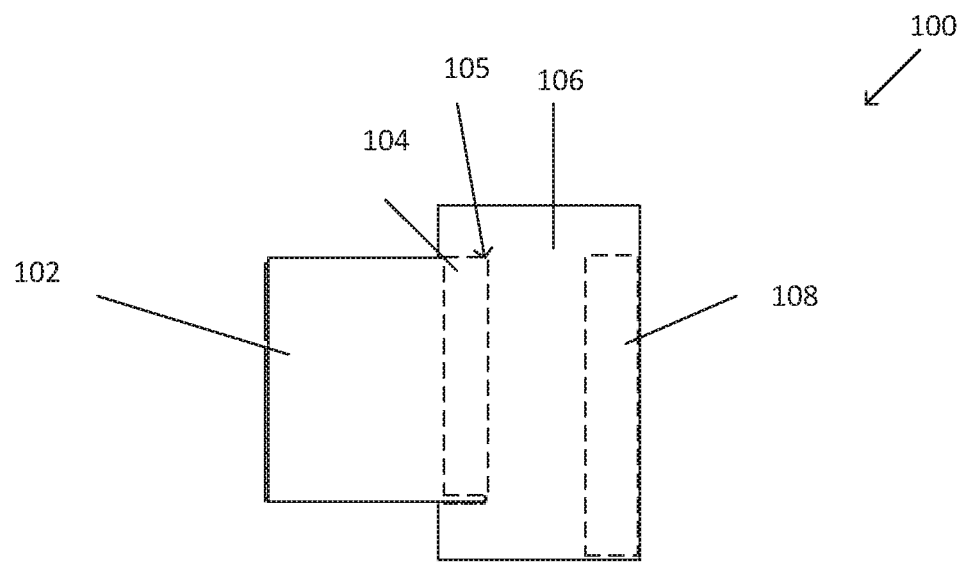
FIG. 1a represents a top view of a package structure according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an microelectronic package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die/device. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die/device may comprise any type of integrated circuit device. In one embodiment, the die may include a processing system (either single core or multi-core). For example, the die may comprise a microprocessor, a graphics processor, a signal processor, a network processor, a chipset, etc. In one embodiment, a die may comprise a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of devices/die.

Conductive interconnect structures may be disposed on a side(s) of a die/device, and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder (e.g., in the form of balls or bumps) may be disposed on the terminals of the substrate and/or die/device, and these terminals may then be joined using a solder reflow process. Of course, it should be understood that many other types of interconnects and materials are possible (e.g., wirebonds extending between a die and a substrate).

The terminals on a die may comprise any suitable material or any suitable combination of materials, whether disposed in multiple layers or combined to form one or more alloys and/or one or more intermetallic compounds. For example, the terminals on a die may include copper, aluminum, gold, silver, nickel, titanium, tungsten, as well as any combination of these and/or other metals. In other embodiments, a terminal may comprise one or more non-metallic materials (e.g., a conductive polymer). The terminals on a substrate may also comprise any suitable material or any suitable combination of materials, whether disposed in multiple layers or combined to form one or more alloys and/or one or more intermetallic compounds.

For example, the terminals on a substrate may include copper, aluminum, gold, silver, nickel, titanium, tungsten, as well as any combination of these and/or other metals. Any suitable solder material may be used to join the mating terminals of the die and substrate, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter a reflow temperature).

Embodiments of methods of forming packaging structures, such as methods of forming a horizontal bump translation using bridge dies, are described. Those methods/structures may include a die disposed on a surface of a substrate, wherein the die comprises a plurality of high density features located in a high density region of the die, an interconnect bridge embedded in the substrate, wherein the interconnect bridge may comprise a first region disposed on a surface of the interconnect bridge comprising a first plurality of features, wherein the first plurality of features comprises a first pitch between adjacent individual features. A second region disposed on the surface of the interconnect bridge comprises a second plurality of features, wherein the second plurality of features comprises a second pitch between adjacent individual features, wherein the second pitch is greater than the first pitch. The embodiments herein enable bump density relaxation//translation and flexible bump/via pattern design, for example.

Figure 1B:
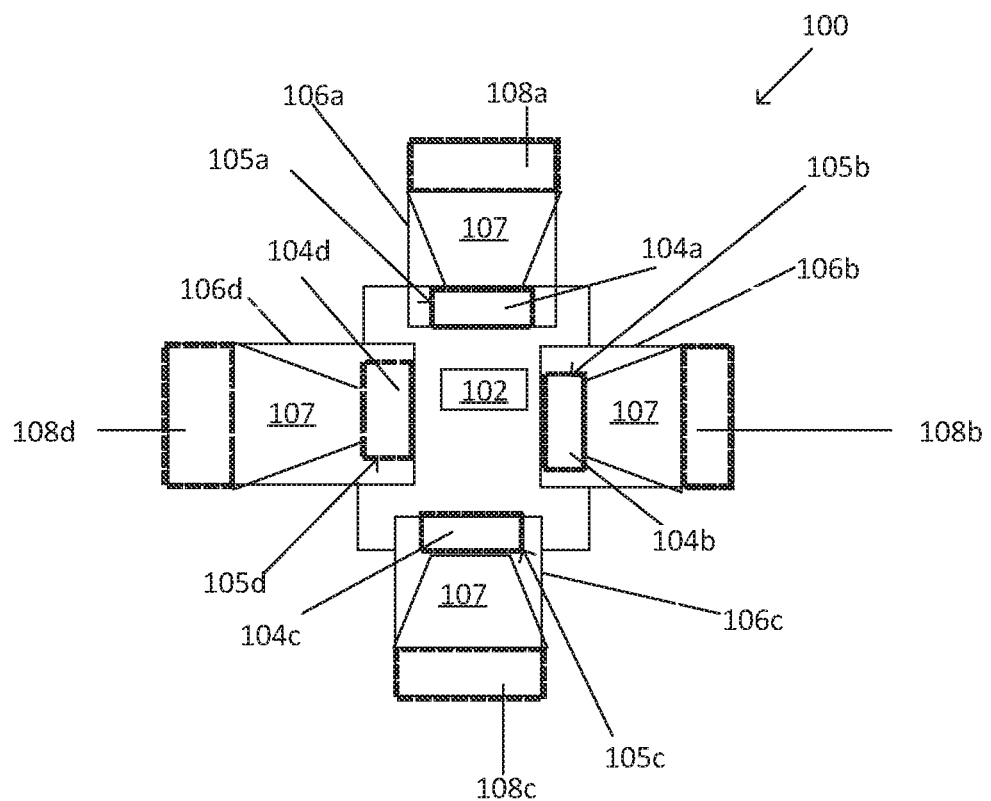
FIG. 1b represents a top view of a package structures according to embodiments.

FIGS. 1a-1b illustrate top views of embodiments of package structures/assembles comprising an interconnect bridge die including a low density and a high density region for horizontal translation of pitch densities. In FIG. 1a (top view), a portion of a package structure 100 is depicted, and may comprise any type of microelectronic package 100, such as a multi-die package, for example. The portion of the package 100 may include a die/device 102. The die 102 may comprise any type of die, such as a microprocessor, a chipset, a graphics device, a wireless device, a memory device, an application specific integrated circuit, or the like.

The die 102 may comprise a high density region 104, wherein a plurality of high density features, such as conductive bumps, for example, may be located. The plurality of high density features disposed in the high density region 104 may comprise a pitch between adjacent individual features. The pitch may comprise between about 10 to about 80 microns, in an embodiment. In other embodiments, the pitch of the high density features may comprise any suitable pitch for very fine conductive circuit features. An interconnect bridge 106 may be adjacent the die 102. The interconnect bridge may comprise an embedded silicon bridge structure which may be embedded in a substrate (not shown). A first region 105 of the interconnect bridge 106 may be located beneath the high density region 104 of the die 102. The first region 105 may comprise a high density region 105 disposed on a surface of the interconnect bridge 106, wherein a first plurality of features (to be described in further detail herein), such as conductive bumps or vias, for example, may be located.

The first plurality of features may comprise a first pitch between adjacent individual features that is similar in magnitude to a pitch of the plurality of high density features disposed on the die. In an embodiment, the first plurality of features comprises a pitch of between about 10 to about 80 microns, for example. The first plurality of features located in the high density region 105 of the interconnect bridge 106 may be electrically and physically coupled to the plurality of high density features disposed within the high density region 104 of the die 102. The interconnect bridge 106 may further comprise a second, low density region 108, wherein a second plurality of features may be located, and wherein the second plurality of features may be physically and electrically coupled with the first plurality of features, as will be further described herein.

The second plurality of features 108 may comprise a less dense, more relaxed second pitch, and may comprise a second pitch in some cases of greater than about 100 microns. The plurality of features located on the surface of the two regions of the interconnect bridge 106 serve to horizontally translate/transform the high pitch, very fine features located in the high density region 104 of the die 102, to an underlying low density substrate, without the use of vertical pitch translation structures, such as through silicon vias (TSV), or interposer structures, for example.

FIG. 1b depicts an embodiment wherein the die 102 may comprise four high density regions 104a, 104b, 104c, 104d. Four interconnect bridges 106a, 106b, 106c, 106d may be disposed adjacent the high density regions of the die 102, wherein high density regions 105a, 105b, 105c, 105d of the interconnect bridges underlie the high density regions 104a, 104b, 104c, 104d of the die 102. In other embodiments, the die 102 may comprise any number of high density regions/locations 104, and the number and shape of the adjacent interconnect bridges 108 may vary as well, depending upon the particular application.

The location of the high density regions 105 and low density regions 108 of the interconnect bridge 106 may vary depending upon the particular design requirements. The low density regions 108 and the high density regions 105 are disposed on a surface of the interconnect bridge 106, such that the pitch translation from the die 102 to an underlying substrate by the interconnect bridge 106 is achieved horizontally, and not vertically as in prior art translation structures, such as interposers and/or TSV's. The low and high density regions 105, 108 of the interconnect bridge 106 may be separated by a fanout region 107, wherein conductive traces may couple, physically and electrically, the plurality of features of the high density region 105 to the plurality of features of the low density regions 108.

Figure 2:
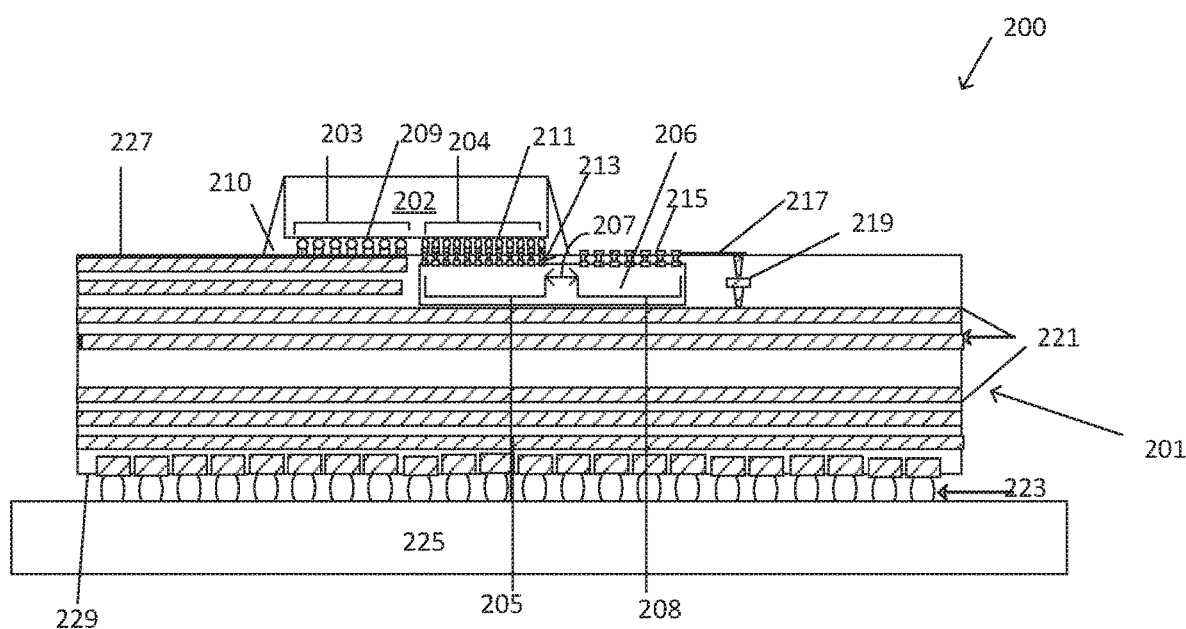
FIG. 2 represents a cross-sectional views of a package structure according to embodiments.

FIG. 2 depicts a cross sectional view of a package structure 200. A die 202 may be disposed on a first surface 227 of a substrate 201. The package structure 200 may comprise any number of die 202 disposed on the substrate 201. The package structure 200 may comprise a plurality of stacked die, or may comprise a multi-die package structure 200, in some embodiments. In an embodiment, the die 202 may comprise a low density region 203, wherein the low density region may comprise a plurality of low density features 209, such as conductive bumps, for example, and wherein a pitch between individual adjacent low density features 209 may comprise greater than about 100 microns, for example.

The die 202 may further comprise a high density region 204, wherein a plurality of high density features 211 may be located, and may comprise a plurality of very fine pitched features. In an embodiment, the plurality of high density features 211 may comprise a pitch of between about 10 to about 80 microns, but may comprise other pitch values consistent with very fine pitched features, depending upon the particular application. An interconnect bridge 206 may be embedded within the substrate 201, and may comprise a silicon interconnect bridge 206, wherein a layer of dielectric may encompass the interconnect bridge 206 (not shown).

The interconnect bridge 206 may comprise a first, high density region 205, wherein a first plurality of features 213 may be disposed, and wherein adjacent individual features may comprise a first pitch of about 10 to about 80 microns in an embodiment. The first pitch of the first plurality of features 213 may be of a similar magnitude as the plurality of high density features 211, such that the plurality of high density features 211 disposed on the die 202 and the first plurality of features 213 on the surface of the interconnect bridge may be physically and electrically coupled to each other. The interconnect bridge 206 may comprise a second, low density region 208 adjacent the high density region 205, that may be electrically and physically coupled to the first, high density region 205 by a fan out region 207. The fan out region 207 may comprise conductive traces that electrically and physically coupled the first plurality of features 213 to the second plurality of features 215. A molding compound 210 may be disposed on at least a portion of the die 202 and over a portion of the interconnect bridge 206.

At least one conductive interconnect structure/trace 217 may couple the second plurality of features 215 of the interconnect bridge to a vertical conductive structure, such as a via 219, which is in electrical connection with substrate layers/features 221 disposed within the substrate 201. In an embodiment, the substrate 201 may comprise a plurality of features comprising a third pitch, wherein the third pitch is larger than the second pitch, and wherein the second plurality of features 215 are electrically and physically coupled to the substrate 201 plurality of features by the at least one conductive trace 217. A plurality of solder balls 223 may be disposed on a second surface 229 of the substrate 201, which may couple the substrate 201 to a board 225, such as a motherboard, for example. The board 225 may comprise any suitable type of circuit board or other substrate capable of providing electrical communication between one or more of the various components disposed on the board 225.

In one embodiment, for example, the board 225 may comprise a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 225. However, it should be understood that the disclosed embodiments are not limited to the above-described PCB and, further, that board 225 may comprise any other suitable substrate.

Figure 3A:
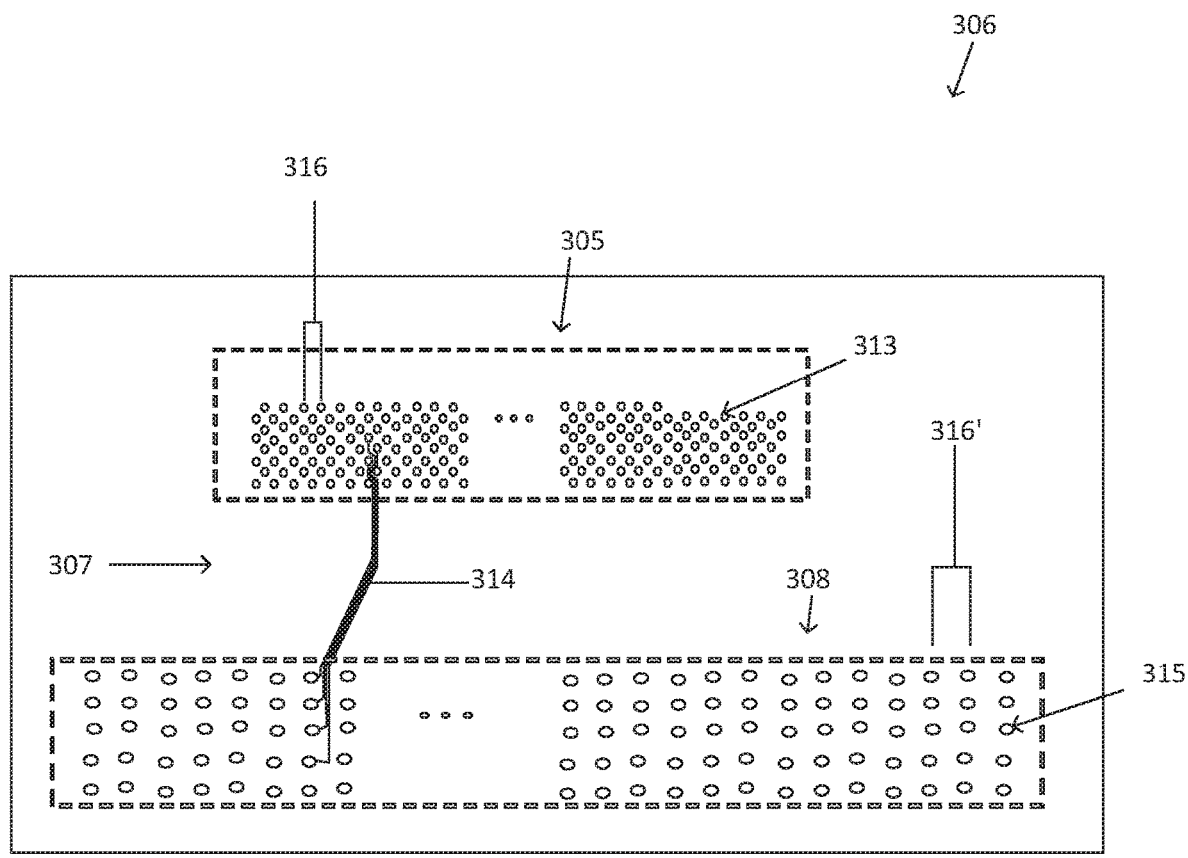
FIG. 3a represents a top view of a portion of a package structure according to embodiments.
Figure 3B:
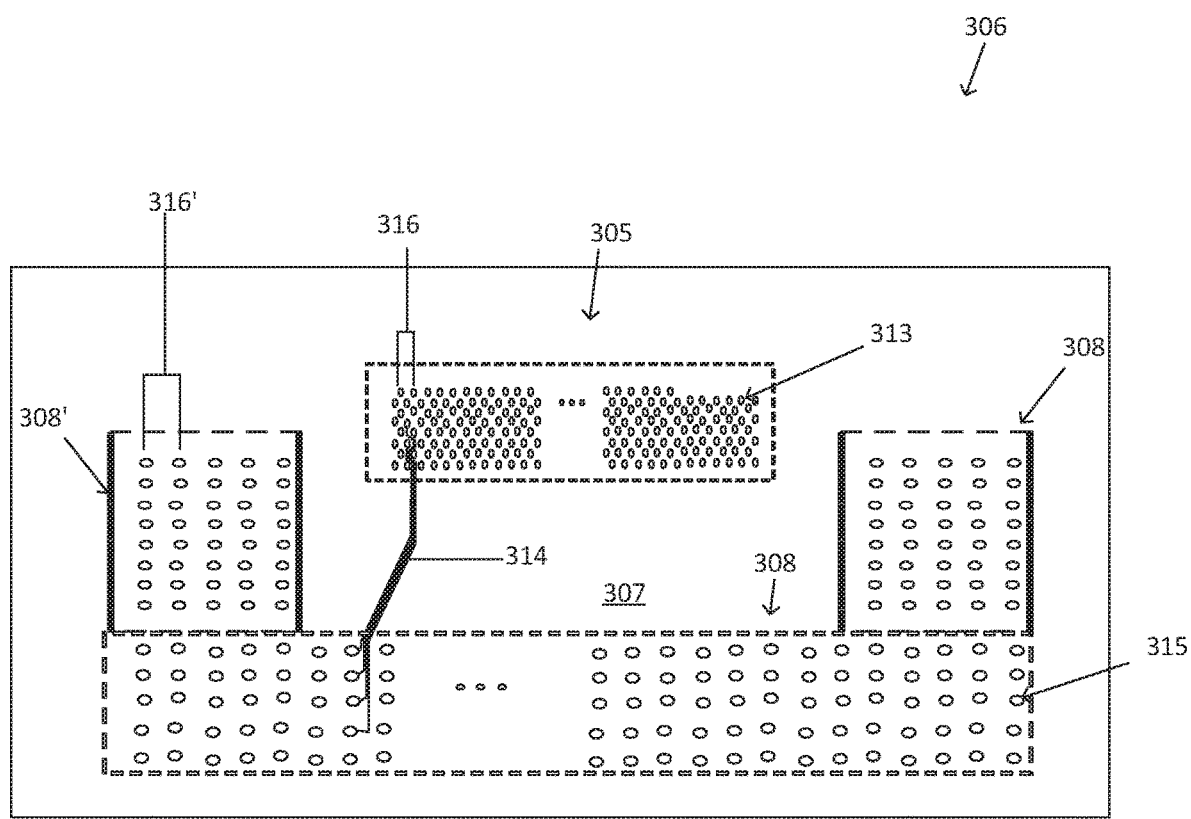
FIG. 3b depicts a top view of a portion of a package structure according to embodiments.
Figure 3C:
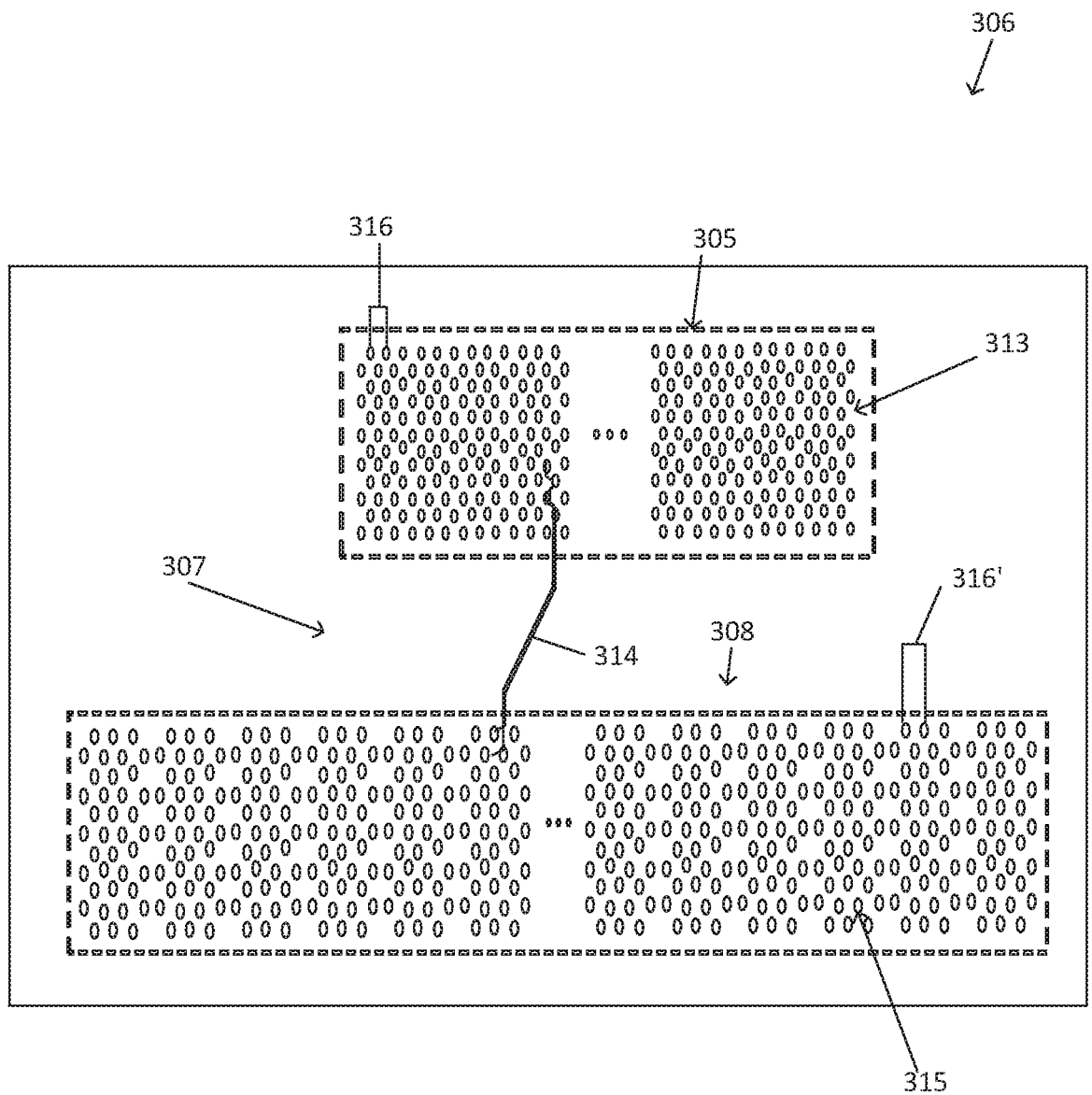
FIG. 3c depicts a top view of a portion of a package structure according to embodiments.

FIGS. 3a-3c depict top views of embodiments of an interconnect bridge, such as the embedded interconnect bridge of FIG. 2, for example. In FIG. 3a, an interconnect bridge 306 may comprise a first, high density region 305, wherein a first plurality of features 313 may be disposed on a surface of the interconnect bridge 306, and may not appreciably extend vertically through the interconnect bridge 306. A first pitch 316 between adjacent individual features, which may comprise a plurality of bumps, pads, micro-vias, or any other features, may comprise between about 10 microns and about 80 microns, in an embodiment.

A second, low density region 308, may comprise a second plurality of features 315, which may comprise a pitch 316' between adjacent individual features of above about 100 microns, for example and may not appreciably extend vertically through the interconnect bridge 306. Both the first plurality of features 313 disposed in the high density region 305 and the second plurality of features 315 disposed in the low density 308 may comprise a rectangular distribution/pattern, in an embodiment. In other embodiments, the first and second plurality of features 313, 315 may comprise other patterns, such as a hexagonal pattern, for example. A fan out region 307 may be located between the low density region 308 and the high density region 305, and may include conductive traces 314 that may physically and electrically couple the high density plurality of features 313 to the low density features 315. In this manner, the pitch of the high density features 311 of the die may be horizontally translated to the lower density pitch 316' of the low density region, and may be further translated to low density pitches between features, which may comprise about 100 micron pitch or above, for example, that may be located in the substrate, below the interconnect bridge 306.

In FIG. 3b, an interconnect bridge 306 is depicted comprising a high density region 305, wherein a plurality of features 313 may be disposed on a surface of the interconnect bridge 306, and may not appreciably extend vertically through the interconnect bridge 306. A pitch 316 between adjacent individual features, may comprise between about 30 microns and about 60 microns, in an embodiment. A low density region 308, may comprise a plurality of features 315, which may comprise a pitch 316' between adjacent individual features of above about 100 microns, for example and may not appreciably extend vertically through the interconnect bridge 306. The low density region 308, which may comprise a rectangular distribution/pattern, in an embodiment, may further comprise extension portions 308', so that the low density region 308, 308' is disposed on three sides of the interconnect bridge 306. A fan out region 307 may be located between the low density region 308 and the high density region 305, and may include conductive traces 314 that may physically and electrically couple the high density plurality of features 313 to the low density features 315.

In FIG. 3c, an interconnect bridge 306 is depicted comprising a high density region 305, wherein a plurality of features 313 may be disposed on a surface of the interconnect bridge 306, and may not appreciably extend vertically through the interconnect bridge 306. A pitch 316 between individual features, may comprise between about 10 microns and about 80 microns, in an embodiment. A low density region 308, may comprise a plurality of features 315, which may comprise a pitch 316' between adjacent features of above about 100 microns, for example and may not appreciably extend vertically through the interconnect bridge 306. The low density region 308, may comprise a hexagonal distribution/pattern of features 315, in an embodiment. A fan out region 307 may be located between the low density region 308 and the high density region 305, and may include conductive traces 314 that may physically and electrically couple the high density plurality of features 313 to the low density features 315.

The embodiments described herein include an interconnect bridge which provides a horizontal pitch space transformer, wherein the interconnect bridge transfers the fine bump pitch of a die to a relaxed bump/via pitch on a package substrate. The embodiments do not require vertical pitch translation, such as provided by TSV and/or interposer structures. The interconnect bridge dies employed in the embodiments herein act as an intermediate media to realize bump density relaxation and flexible bump/via pattern design. The embodiments allow for transforming high density IO bump patterns which could not be routed on inexpensive package substrates, to IO bump/via patterns with much lower bump/via density and larger bump pitch.

The embodiments enable packaging die having a very high bump density (such as about 55 micron bump pitch, for example) using conventional low density package substrates. For example, certain die blocks are designed with very fine bump pitch, such as below about 45 micron bump pitch, for silicon interposer applications. By applying the embodiments, the bump pitch of the block on the die can be horizontally transformed and packaged using low cost, lower pitch substrates. The embodiments may be employed to produce cost effective products for single and multi chip packaging. The final geometrical features (pads, micro via, fine interconnects in sub micron range etc.) which are included in the interconnect bridges of the various embodiments herein enable die with very fine bump pitch to be routed to underlying low density substrates.

The embodiments offer several advantages. Horizontal bump pitch is achieved by employing space transformation without using 3D integration with TSV's and/or silicon interposers. The embodiments can be applied to a localized area or to a larger areas of a rectangular package substrate, depending on the design requirements. The embodiments offer intellectual property (IP) integration flexibility-by using the embodiments, IP with very dense bump pitch can be directly integrated into a die, and does not require redesign. By allowing fine input output (JO) bump pitch on a die, the embodiments enable die size reduction which in turn reduces fabrication cost. The horizontal bump pitch space transformation of the embodiments allows for flexible relaxed via/bump pattern design for IP requirements, the number of IOs required to be connected, space available, cost and design constraint, for example. Also, the via or bump pattern in the low density, relaxed region can be customized, and possesses the flexibility to be co-optimized while doing package design. For example, the low density region can use shallower pattern in order to reduce the package layers to route all the IOs and save cost.

Figure 4:
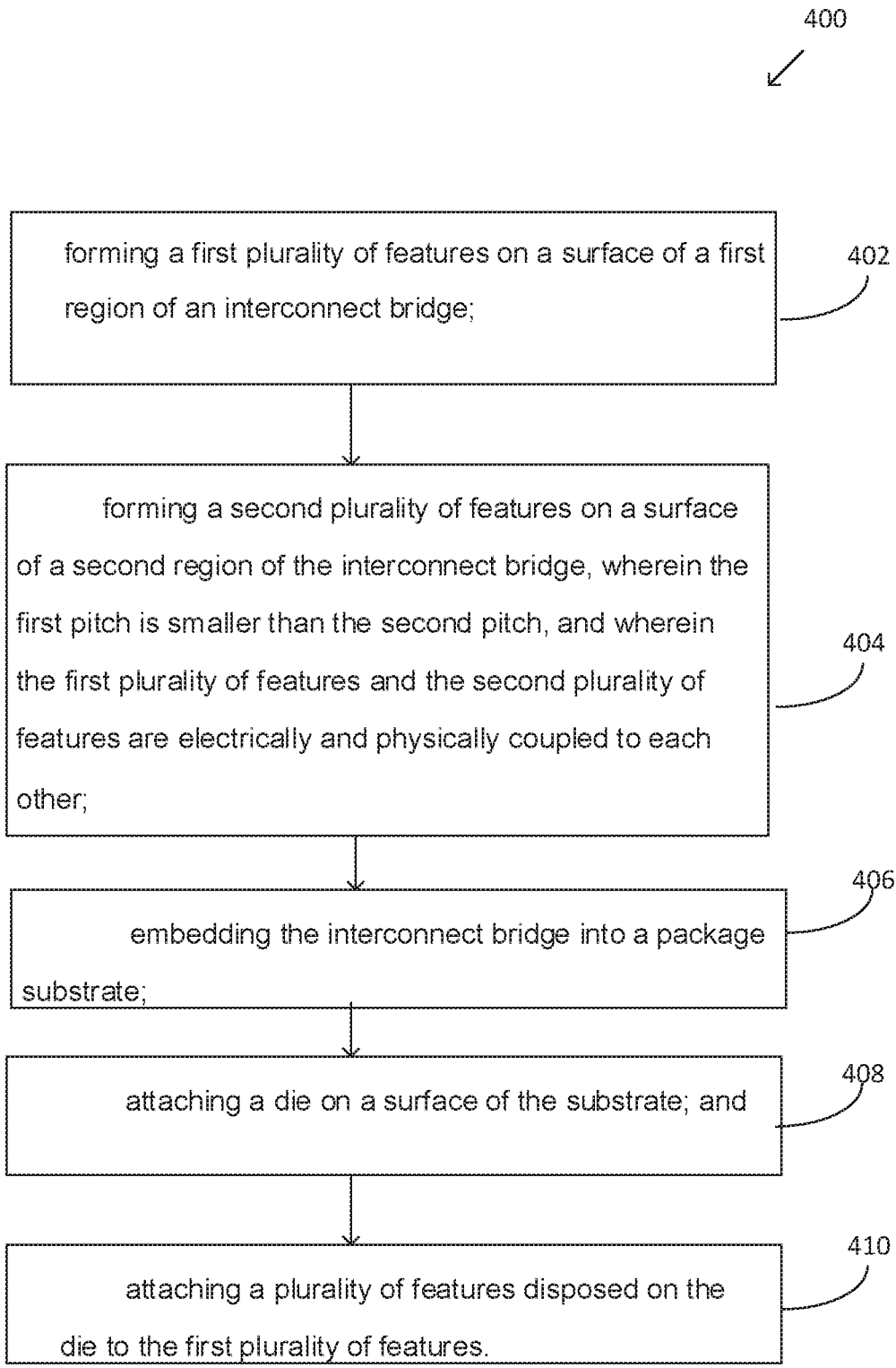
FIG. 4 represents a flow chart of a method of forming package structures according to embodiments.

FIG. 4 depicts a method 400 according to embodiments herein. At step 402, a first plurality of features comprising a first pitch may be formed on a surface of a first region of an interconnect bridge. The first plurality of features may comprise a high density plurality of features, and may comprise a pitch of between about 10 microns to about 80 microns, in some embodiments. The first plurality of features may comprise a plurality of conductive vias and/or bumps, in an embodiment. The first plurality of features may not appreciably extend vertically through the interconnect bridge. At step 404, a second plurality of features comprising a second pitch may be formed on a surface of a second region of the interconnect bridge, wherein the first pitch is smaller than the second pitch, and wherein the first plurality of features and the second plurality of features are electrically and physically coupled to each other. The second pitch may comprise above about 100 microns in an embodiment, and the second plurality of features may not appreciably extend vertically through the interconnect bridge.

A fan out region may be located between the first plurality of features and the second plurality of features, and may include conductive traces that may physically and electrically couple the first plurality of features to the second plurality of features. At step 406 the interconnect bridge may be embedded into a package substrate. The interconnect bridge may comprise silicon, and may be fully embedded, and may be isolated within the substrate by a layer of dielectric material surrounding the interconnect bridge, in an embodiment. At step 408, a die may be attached on a surface of the substrate. At step 410, a plurality of high density features disposed on the die may be attached to the first plurality of features on the interconnect bridge. The plurality of high density features may comprise a compatible pitch with the first plurality of features disposed on the interconnect bridge, and may comprise a pitch of between about 10 microns to about 80 microns, in an embodiment.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, an ultrabook, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 5:
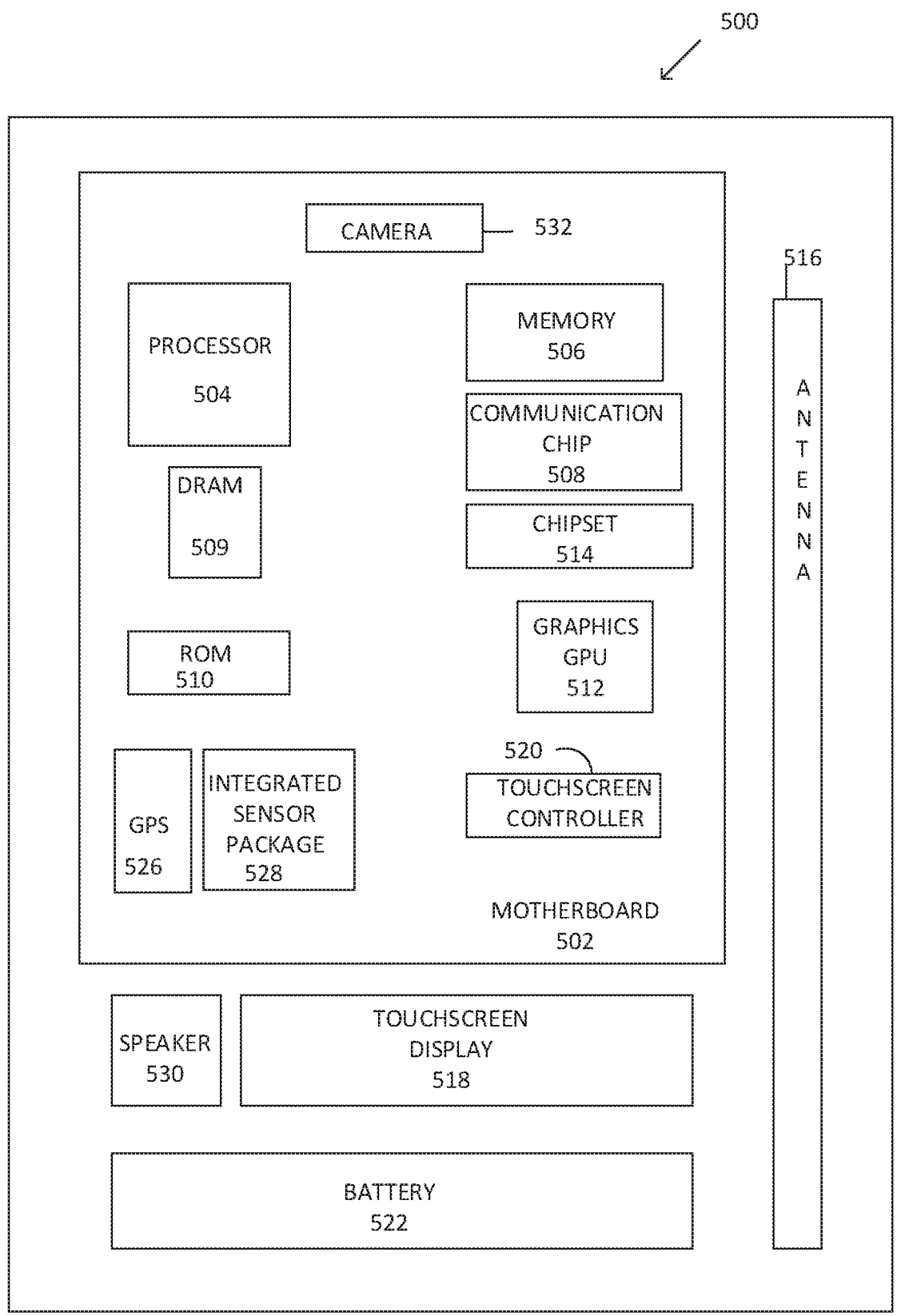
FIG. 5 represents a schematic of a computing device according to embodiments.

FIG. 5 is a schematic of a computing device 500 that may be implemented incorporating embodiments of the package structures described herein. For example, any suitable ones of the components of the computing device 500 may include, or be included in, package structures/assemblies, such as is depicted in FIG. 2, wherein an interconnect bridge embedded in a substrate may comprise a first plurality of features disposed on a surface comprising a first pitch, and a second plurality of features disposed on the surface comprising a second pitch, wherein the interconnect bridge is capable of performing horizontal bump pitch translation from a die disposed on a surface of the substrate to circuit features disposed within the substrate. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 508 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, an integrated sensor 528, a speaker 530, a camera 532, compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising: a die disposed on a surface of a substrate, wherein the die comprises a plurality of high density features located in a high density region of the die; an interconnect bridge embedded in the substrate; a first region disposed on a surface of the interconnect bridge comprising a first plurality of features, wherein the first plurality of features comprises a first pitch between adjacent individual features; a second region disposed on the surface of the interconnect bridge comprising a second plurality of features, wherein the second plurality of features comprises a second pitch between adjacent individual features, wherein the second pitch is greater than the first pitch.

Example 2 includes the microelectronic package structure of example 1, wherein at least one of the first plurality of features or the second plurality of features comprises one of a plurality of bumps, a plurality of vias or a plurality of pads.

Example 3 includes the microelectronic package structure of example 1 wherein the first pitch comprises between about 10 microns to about 80 microns.

Example 4 includes the microelectronic package structure of example 1 wherein the second pitch comprises between about 60 microns to about 150 microns.

Example 5 includes the microelectronic package structure of example 1 wherein the high density plurality of features in the high density region of the die comprise a pitch between adjacent individual features of between about 10 microns and about 80 microns.

Example 6 includes the microelectronic package structure of example 1 wherein conductive interconnect structures located in a fan out region disposed between the first region and the second region are physically and electrically coupled to the first plurality of features and the second plurality of features.

Example 7 includes the microelectronic package structure of example 1 wherein the substrate comprises a third plurality of features comprising a third pitch, wherein the third pitch is larger than the second pitch, and wherein the second plurality of features are electrically and physically coupled to the third plurality of features by at least one conductive trace.

Example 8 includes the microelectronic package structure of example 7 wherein the embedded interconnect bridge is capable of translating the pitch of the high density features disposed on the die to the pitch of the third plurality of features disposed on the substrate.

Example 9 is a method of forming a microelectronic package structure comprising: forming a first plurality of features on a surface of a first region of an interconnect bridge; forming a second plurality of features on the surface of a second region of the interconnect bridge, wherein the first pitch is smaller than the second pitch, and wherein the first plurality of features and the second plurality of features are electrically and physically coupled to each other; embedding the interconnect bridge into a package substrate; attaching a die on a surface of the substrate; and attaching a plurality of features disposed on the die to the first plurality of features.

Example 10 includes the method of forming the microelectronic package structure of example 9 wherein the first pitch comprises between about 10 to about 80 microns, and the second pitch comprises greater than about 100 microns.

Example 11 includes the method of forming the microelectronic package structure of example 9 wherein forming the second plurality of features comprises forming a rectangular array of features on the surface of the interconnect bridge.

Example 12 includes the method of forming the microelectronic package structure of example 11 wherein a fan out region is disposed between the first plurality of features and the second plurality of features.

Example 13 includes the method of forming the microelectronic package structure of example 9 wherein forming the second plurality of features comprises forming a hexagonal array of features on the surface of the interconnect bridge.

Example 14 includes the method of forming the microelectronic package structure of example 9 further comprising embedding an additional interconnect bridge into the substrate, wherein the additional interconnect bridge comprises a first plurality of features and a second plurality of features separated by a fan out region, and further connecting the first plurality of features to a plurality of high density features on the die.

Example 15 includes the method of forming the microelectronic package structure of example 9 wherein the die is at least partially disposed over the embedded interconnect bridge, and wherein the plurality of features disposed on the die comprise a pitch between adjacent features of between about 10 microns to about 80 microns.

Example 16 includes the method of forming the microelectronic package structure of example 9, wherein the embedded interconnect bridge die comprises one of a rectangular shape or a trapezoidal shape.

Example 17 is the microelectronic system, comprising: a board; a microelectronic package attached to the board, wherein the microelectronic package comprises: a package disposed on a substrate, wherein the package includes a die disposed on a surface of the substrate, wherein the die comprises a plurality high density features located in a high density region; an interconnect bridge embedded in the substrate comprising a first region and a second region disposed on a surface of the interconnect bridge, wherein the first region comprises a first plurality of features comprising a first pitch, and wherein the second region comprises a second plurality of features comprising a second pitch, wherein the second pitch is greater than the first pitch.

Example 18 includes the microelectronic system of example 17 wherein the first pitch comprises about 10 microns to about 80 microns, and wherein the plurality of high density features disposed on the die and the first plurality of features are electrically coupled to each other by conductive interconnect structures.

Example 19 includes the microelectronic system of example 17 wherein the first plurality of features is coupled to the second plurality of features by conductive traces disposed in a fan out region located between the first plurality of features and the second plurality of features.

Example 20 includes the microelectronic system of example 17 wherein the substrate comprises a third plurality of features comprising a third pitch, wherein the third pitch is larger than the second pitch, and wherein the second plurality of features are electrically and physically coupled to the third plurality of features by at least one vertical conductive trace.

Example 21 includes the microelectronic system of example 17 wherein at least one of the first plurality of features or the second plurality of features comprises a rectangular pattern or a horizontal pattern.

Example 22 includes the microelectronic system of example 17 further comprising wherein the die is at least partially disposed over the embedded interconnect bridge.

Example 23 includes the microelectronic system of example 17 wherein at least one of the first, the second or the third plurality of features comprises one of a plurality of bumps, a plurality of vias or a plurality of pads.

Example 24 includes the microelectronic system of example 17 wherein a pitch between adjacent individual ones of the first plurality of features comprises between about 30 microns to about 60 microns.

Example 25 includes the microelectronic package system of example 24 wherein a pitch between adjacent individual ones of the third plurality of features comprises above about 100 microns.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus, the embodiments are not limited to the structures described herein.

What is claimed is:

1. A microelectronic package structure comprising:
a die disposed on a surface of a substrate, wherein the die comprises a plurality of high density features located in a high density region of the die;
an interconnect bridge embedded in the substrate;
a first region disposed on a surface of the interconnect bridge comprising a first plurality of features, wherein the first plurality of features comprises a first pitch between adjacent individual features;
a second region disposed on the surface of the interconnect bridge comprising a second plurality of features, wherein the second plurality of features comprises a second pitch between adjacent individual features, wherein the second pitch is greater than the first pitch; and
conductive interconnect structures located in a fan out region disposed between the first region and the second region, the conductive interconnect structures in direct physical contact with the first plurality of features and the second plurality of features.

2. The microelectronic package structure of claim 1, wherein at least one of the first plurality of features or the second plurality of features comprises one of a plurality of bumps, a plurality of vias or a plurality of pads.

3. The microelectronic package structure of claim 1 wherein the first pitch comprises between about 10 microns to about 80 microns.

4. The microelectronic package structure of claim 1 wherein the second pitch comprises above about 100 microns.

5. The microelectronic package structure of claim 1 wherein the high density plurality of features in the high density region of the die comprise a pitch between adjacent individual features of between about 10 microns and about 80 microns.

6. The microelectronic package structure of claim 1 wherein the substrate comprises a third plurality of features comprising a third pitch, wherein the third pitch is greater than the second pitch, and wherein the second plurality of features are electrically and physically coupled to the third plurality of features by at least one conductive trace.

7. The microelectronic package structure of claim 6 wherein the embedded interconnect bridge is capable of translating the pitch of the high density features disposed on the die to the pitch of the plurality of features disposed on the substrate.

8. A method of forming a microelectronic package structure comprising:
    forming a first plurality of features on a surface of a first region of an interconnect bridge comprising a first pitch;
    forming a second plurality of features comprising a second pitch on a surface of a second region of the interconnect bridge, wherein the first pitch is smaller than the second pitch, and wherein the first plurality of features and the second plurality of features are electrically and physically coupled to each other by conductive interconnect structures located in a fan out region disposed between the first region and the second region, the conductive interconnect structures in direct physical contact with the first plurality of features and the second plurality of features;
    embedding the interconnect bridge into a package substrate;
    attaching a die on a surface of the substrate; and
    attaching a plurality of features disposed on the die to the first plurality of features.

9. The method of forming the microelectronic package structure of claim 8 wherein the first pitch comprises between about 10 to about 80 microns, and the second pitch comprises greater than about 100 microns.

10. The method of forming the microelectronic package structure of claim 8 wherein forming the second plurality of features comprises forming a rectangular array of features on the surface of the interconnect bridge.

11. The method of forming the microelectronic package structure of claim 8 wherein forming the second plurality of features comprises forming a hexagonal array of features on the surface of the interconnect bridge.

12. The method of forming the microelectronic package structure of claim 8 further comprising embedding an additional interconnect bridge into the substrate, wherein the additional interconnect bridge comprises a first plurality of features and a second plurality of features separated by a fan out region, and further coupling the first plurality of features to a plurality of high density features on the die.

13. The method of forming the microelectronic package structure of claim 8 wherein the die is at least partially disposed over the embedded interconnect bridge, and wherein the plurality of features disposed on the die comprise a pitch between adjacent features of between about 10 microns to about 80 microns.

14. The method of forming the microelectronic package structure of claim 8, wherein the embedded interconnect bridge die comprises one of a rectangular shape or a trapezoidal shape.

15. A microelectronic system, comprising:
    a board;
    a microelectronic package attached to the board, wherein the microelectronic package comprises:
        a package disposed on a substrate, wherein the package includes a die disposed on a surface of the substrate, wherein the die comprises a plurality high density features located in a high density region;
        an interconnect bridge embedded in the substrate comprising a first region and a second region disposed on a surface of the interconnect bridge, wherein the first region comprises a first plurality of features comprising a first pitch, wherein the second region comprises a second plurality of features comprising a second pitch, wherein the second pitch is greater than the first pitch, and wherein the first plurality of features is coupled to the second plurality of features by conductive traces disposed in a fan out region located between the first plurality of features and the second plurality of features, the conductive interconnect structures in direct physical contact with the first plurality of features and the second plurality of features.

16. The microelectronic system of claim 15 wherein the first pitch comprise about 10 microns to about 80 microns, and wherein the plurality of high density features disposed on the die and the first plurality of features are electrically coupled to each other by conductive interconnect structures.

17. The microelectronic system of claim 15 wherein the substrate comprises a plurality of features comprising a third pitch, wherein the third pitch is larger than the second pitch, and wherein the second plurality of features are electrically and physically coupled to the plurality of features disposed in the substrate by at least one vertical conductive trace.

18. The microelectronic system of claim 15 wherein at least one of the first plurality of features or the second plurality of features comprises a rectangular pattern or a horizontal pattern.

19. The microelectronic system of claim 15 further comprising wherein the die is at least partially disposed over the embedded interconnect bridge.

20. The microelectronic system of claim 15 wherein at least one of the first plurality of features or the second plurality of features comprises one of a plurality of bumps, a plurality of vias or a plurality of pads.

21. The microelectronic system of claim 15 wherein a pitch between adjacent individual ones of the first plurality of features comprises between about 10 microns to about 80 microns.

22. The microelectronic package system of claim 21 wherein a pitch between adjacent individual ones of the third plurality of features comprises above about 100 microns.

* * * * *